United States Patent [19]

Stone, Jr.

[11] Patent Number: 5,164,888
[45] Date of Patent: Nov. 17, 1992

[54] METHOD AND STRUCTURE FOR IMPLEMENTING DYNAMIC CHIP BURN-IN

[75] Inventor: Earl H. Stone, Jr., Essex, Vt.

[73] Assignee: International Business Machines, Armonk, N.Y.

[21] Appl. No.: 584,199

[22] Filed: Sep. 18, 1990

Related U.S. Application Data

[62] Division of Ser. No. 291,841, Dec. 29, 1988, Pat. No. 4,918,817.

[51] Int. Cl.⁵ .............................................. H05K 1/00
[52] U.S. Cl. .................................... 361/398; 174/254; 174/260; 174/268; 357/69; 357/70; 361/400; 361/409; 361/412
[58] Field of Search .............. 174/251, 253, 254, 256, 174/257, 258, 261, 268; 357/80, 69, 70; 361/398, 399, 400, 408, 409, 410, 411, 414, 419; 439/67, 77, 72; 324/158 F; 228/180.1, 180.2; 29/827, 829, 830, 832, 846

[56] References Cited

U.S. PATENT DOCUMENTS

| | | | |
|---|---|---|---|
| 782,391 | 2/1905 | Hanson | 174/268 |
| 3,499,098 | 3/1970 | McGahey et al. | 174/260 |
| 3,818,279 | 6/1974 | Seeger et al. | 174/254 |
| 4,386,389 | 5/1983 | Proebsting | 361/398 |
| 4,426,548 | 1/1984 | Oritsuki et al. | 361/410 |
| 4,701,781 | 10/1987 | Sankhagowit | 361/398 |
| 4,981,817 | 1/1991 | Stone, Jr. | 437/206 |
| 5,028,983 | 7/1991 | Bickford et al. | 357/69 |

FOREIGN PATENT DOCUMENTS

| | | | |
|---|---|---|---|
| 15583A1 | 9/1980 | European Pat. Off. | |
| 0215425 | 11/1984 | Fed. Rep. of Germany | 357/69 |
| 0105546 | 6/1983 | Japan | 357/69 |
| 199544 | 11/1983 | Japan | |
| 185949 | 8/1986 | Japan | |
| 8201803 | 5/1982 | PCT Int'l Appl. | 174/260 |
| 2004127 | 3/1989 | United Kingdom | |
| 8304141 | 11/1983 | World Int. Prop. O. | 357/75 |

OTHER PUBLICATIONS

IBM Technical Disclosure Bulletin "Burn-in Methodology for Tab Using Separate Signal Carrier Tape" vol. 32 No. 1 Jun. 1989.

*Primary Examiner*—Leo P. Picard
*Assistant Examiner*—Donald A. Sparks
*Attorney, Agent, or Firm*—Calfee, Halter & Griswold

[57] ABSTRACT

A method and structure for implementing dynamic burn-in of semi-conductor chips in TAB processing is provided. The semi-conductor chips are mounted on a wire pattern formed on the obverse side of an insulating tape in a conventional way. The insulating tape has a plurality of openings extending therethrough, one opening between each adjacent location of a chip. Wires from the wiring pattern at each chip location pass over the openings on the obverse side of the tape. A second insulating tape is provided which has a series of parallel conductors formed on one surface thereof. The spacing of the conductors corresponds to the spacing of the wires over the openings.

The second tape is applied to the reverse surface of the first tape with the conductors on the second tape in registration with the wires over the openings in the first tape and the wires are electrically bonded to the conductors. Thus, various voltage and signal levels can be supplied for all of the chips simultaneously during dynamic burn-in.

4 Claims, 3 Drawing Sheets

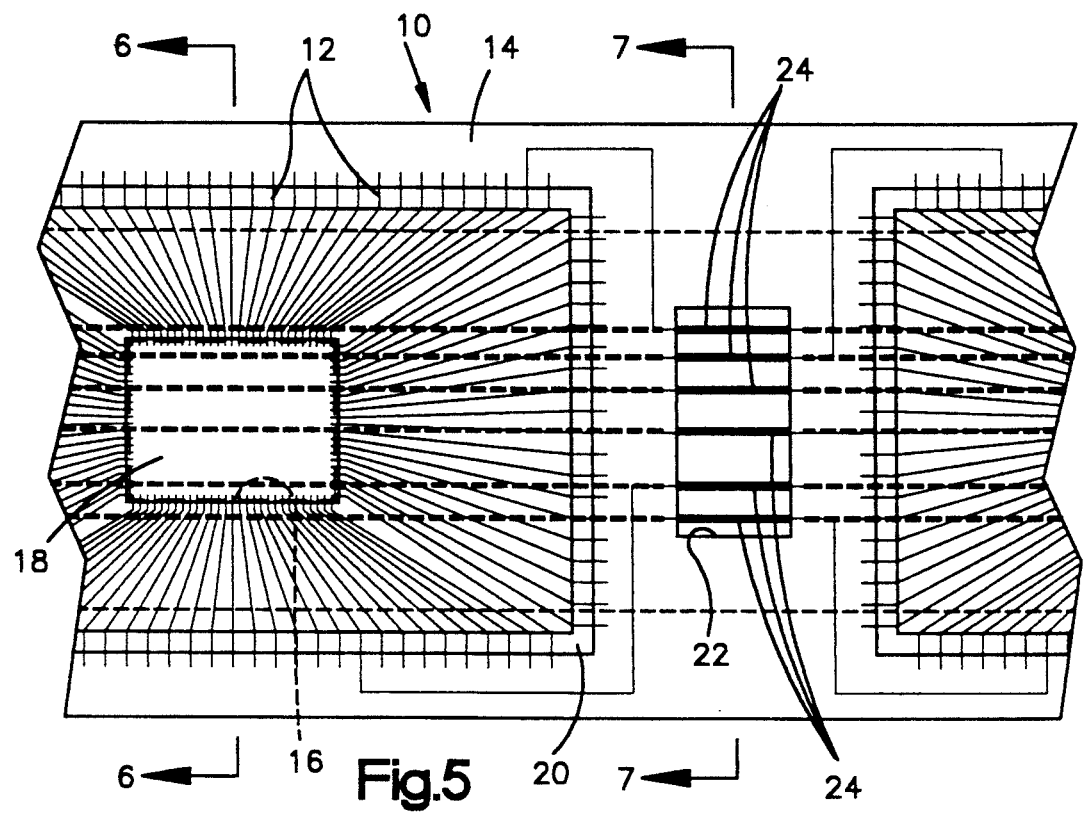
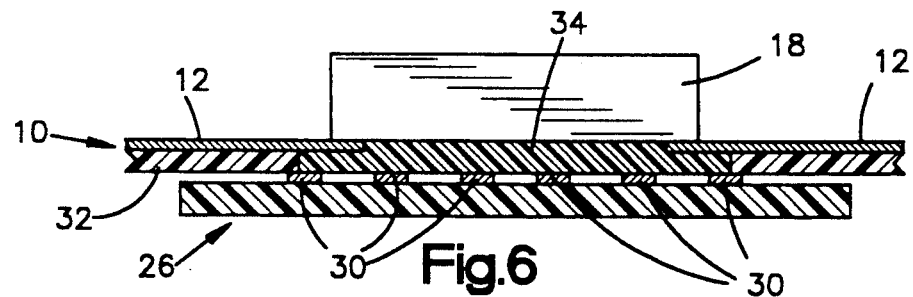
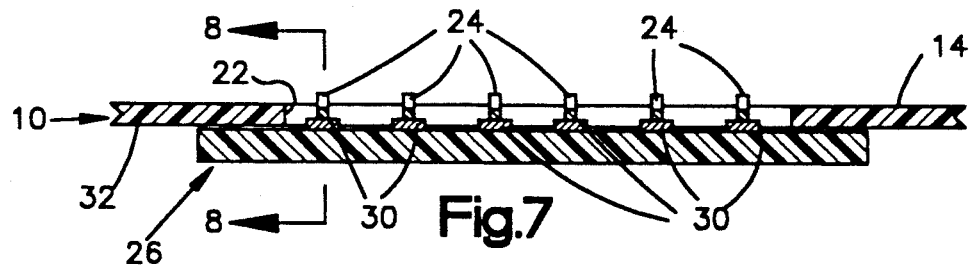
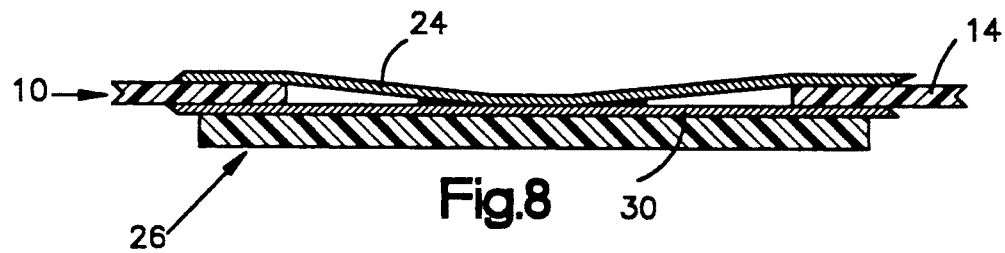

METHOD AND STRUCTURE FOR IMPLEMENTING DYNAMIC CHIP BURN-IN

This is a divisional of co-pending application Ser. No. 07/291,841, filed on Dec. 29, 1988, now U.S. Pat. No. 4,918,817.

BACKGROUND OF THE INVENTION

1. Field of the Invention

This invention relates generally to the manufacturing of tape automatic bonded semi-conductor chips and more particularly to a structure and technique for improving the dynamic burn-in operation in the manufacturing process of mounting integrated circuit chips on electrical wires for further packaging.

2. Prior Art

One technique for mounting integrated circuit chips utilizes a process known as tape automated bonding (TAB). In this technique an elongated insulating tape is provided which has electrical circuit lines formed thereon by conventional plating and etching processes so as to form a series of locations along the tape with each location having the desired wire pattern on which each integrated circuit chip is to be bonded. Automated machinery passes the tape past a chip mounting station wherein the desired integrated circuit chips are attached serially along the tape to the wiring pattern formed at each location. As the chips are applied to the various locations individually, a testing function is performed along with the bonding operation to make an initial determination of chips which are clearly unacceptable. These chips may then be immediately removed and not further processed.

However, it is known practice in the art of tape automated bonding to perform an operation which is known as a "dynamic burn-in" of the chip. To perform this dynamic burn-in the chip is heated to about 120° C. and a voltage in excess of normal operating voltage and signals are applied to various locations of the chip to exercise the chip. It has been found that this particular technique can be used to readily identify those chips that while apparently testing good in the initial testing phase nevertheless have a very early failure mode. The dynamio burn-in accelerates this early failure rate so that the chips may be identified as failed chips immediately following the dynamic burn-in operation and removed from further processing. It has also been suggested by some that the dynamic burn-in may in fact actually increase the life of an integrated circuit chip. In any event, the dynamic burn-in is conventionally performed as a part of the processing step in manufacturing TAB semi-conductor chips.

As indicated above, the dynamic burn-in requires power, and ground potential, as well as various signal levels to be applied to the chip. When the chip remains on the insulating tape, the geometry of the tape is such that only two different signal levels or power levels can be applied simultaneously to all of the chips; i.e. one level being applied by a line running down one margin of the chip and a second level applied by a line running down the other margin of the tape. Any additional signal or power levels would require crossing of wires which cannot be readily achieved in the process of forming wire patterns on the tape. Thus the dynamic burn-in of the chips has conventionally required the chips to be individually powered and signaled for this dynamic burn-in operation.

SUMMARY OF THE INVENTION

It has been found that a plurality of power, ground and signal levels can be applied to chips while they remain attached to the tape during the dynamic burn-in in a TAB manufacturing operation. According to this technique semi- conductor chips are mounted serially on printed circuit wires formed on the obverse surface of a first insulating tape in a conventional manner. Openings are provided which extend through the insulating tape at locations between each chip location on the insulating tape. A plurality of the circuit wires from each chip location extend over the openings on the obverse side of the first insulating tape. A second insulating tape is applied to the reverse side of the first insulating tape, the second insulating tape having longitudinally extending conductors formed on the face thereof contacting the first insulating tape and positioned to extend across the openings in registration with the wires on the obverse side of the first insulating tape extending above the opening. The conductors are electrically bonded to the wires through the openings to thereby allow electrical power and signals to be supplied to the various locations of each of the chips simultaneously during burn-in operation. The burn-in operation can be performed by rolling up the tapes with the chips secured thereto and placed in an oven and when they reach the desired temperature electrical signals and required voltage levels are supplied through the various conductors to exercise the chips.

DESCRIPTION OF THE DRAWING

FIG. 4 is a side elevational view somewhat diagrammatic showing the tapes coiled for insertion into an oven for dynamic burn-in;

FIG. 5 is a detailed view of a portion of the tapes shown in FIG. 3 on an enlarged scale;

FIG. 6 is a sectional view taken substantially along the plane designated by line 6—6 of FIG. 5;

FIG. 7 is a sectional view taken substantially along the plane designated by line 7—7 of FIG. 5; and FIG. 8 is a sectional view taken substantially along the plane designated by the line 8—8 of FIG. 7.

DESCRIPTION OF THE PREFERRED EMBODIMENT

Figure 1:
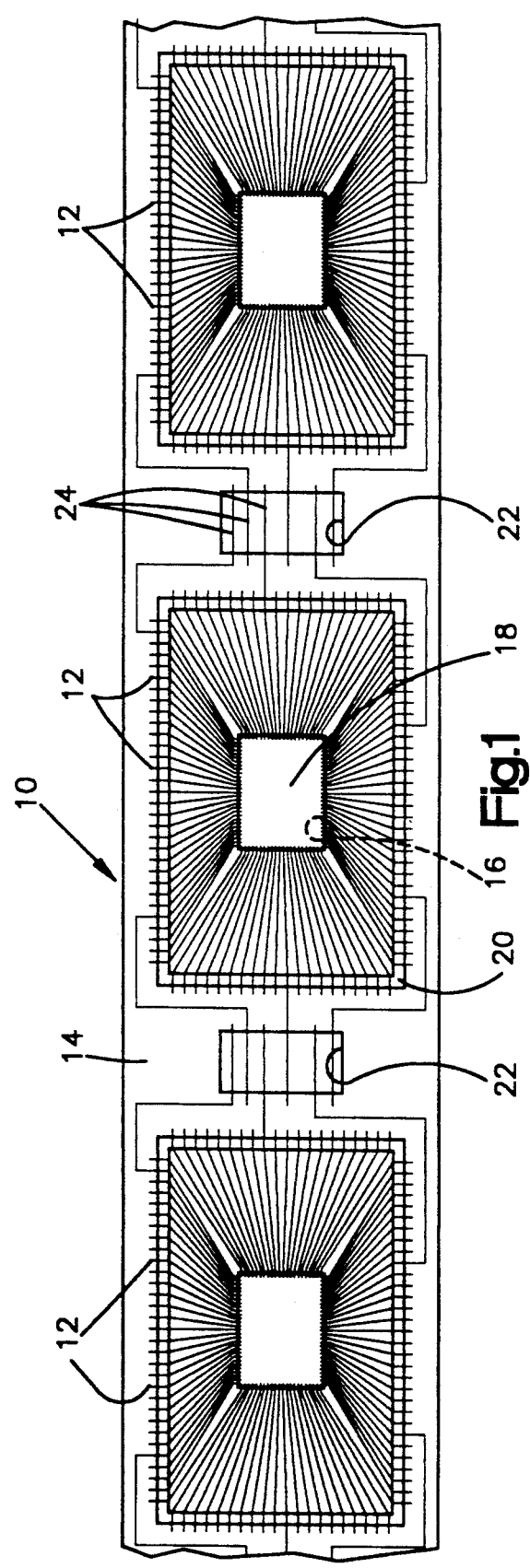
FIG. 1 is a plan view somewhat diagrammatic of the obverse side of an insulating tape wherein conductor patterns are formed thereon and semiconductor chips are mounted on the pattern with openings formed in the tape according to this invention.

Referring now to the drawing and for the present to FIG. 1, a conventional insulating tape 10 is shown which may be formed from any one of a number of materials. Polyimide sold by DuPont under the Trade Name Kapton is especially suited for this particular purpose. The tape has been formed with conventional circuit pattern lines 12 on the obverse surface 14 thereof at spaced locations there along. It is to be understood that the depiction of the circuit pattern 12 in FIG. 1 is merely diagrammatic and representative and that normally there would be a somewhat more intricate pattern of a greater number of more closely spaced lines, it being appreciated that the FIGURES herein are illustrative only of the technique involved and are not intended to be a representative of any specific circuit pattern for any particular chip.

As is conventional, a central window 16 is formed over which the circuit lines 12 extend and a chip 18 is bonded to the circuit lines 12 in a conventional well-known manner. A bordering or framing rectangular opening 20 is also provided which circumscribes the chip and as is as well known in the art will eventually serve the purpose of allowing the chip to be severed to provide the necessary exposed electrical connections for further packaging of the chips. This is all conventional in the prior art and does not per se constitute any portion of the invention.

Also it is conventional in the art when the chips 18 are mounted on the circuit pattern wires 12 that a testing function is performed on each chip to give an initial indication of whether the chip is good or bad. Those which are bad can be immediately removed or cut out and those which are good will continue in the processing. However as indicated above, subsequent dynamic burn-in will reveal any chips while appearing in the initial test to be good, nevertheless are prone to early failure; and it is to an improved technique and structure for accomplishing the dynamic burn-in to which the instant invention is directed.

To this end a series of rectangular openings 22 are formed through the insulating tape 10, one rectangular opening being formed between each adjacent chip location as shown in FIG. 1. The circuit line pattern 12 for each chip location includes several lines 24 which pass over the window 22 on the obverse surface 14 of the tape. In the illustrated embodiment three lines 24 per chip location are shown passing over at the window; however, it is to be understood that there could be many more wires or lines and this showing is for illustration purposes only.

Figure 2:
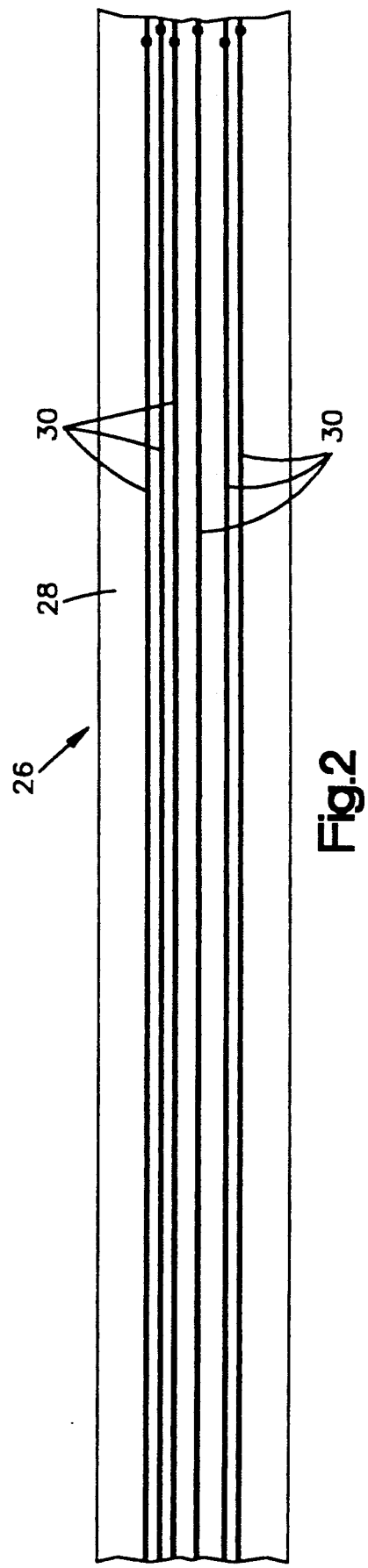
FIG. 2 is a plan view of a second insulating tape having longitudinally extending conductors thereon for application to the reverse side of the tape of FIG. 1.
Figure 3:
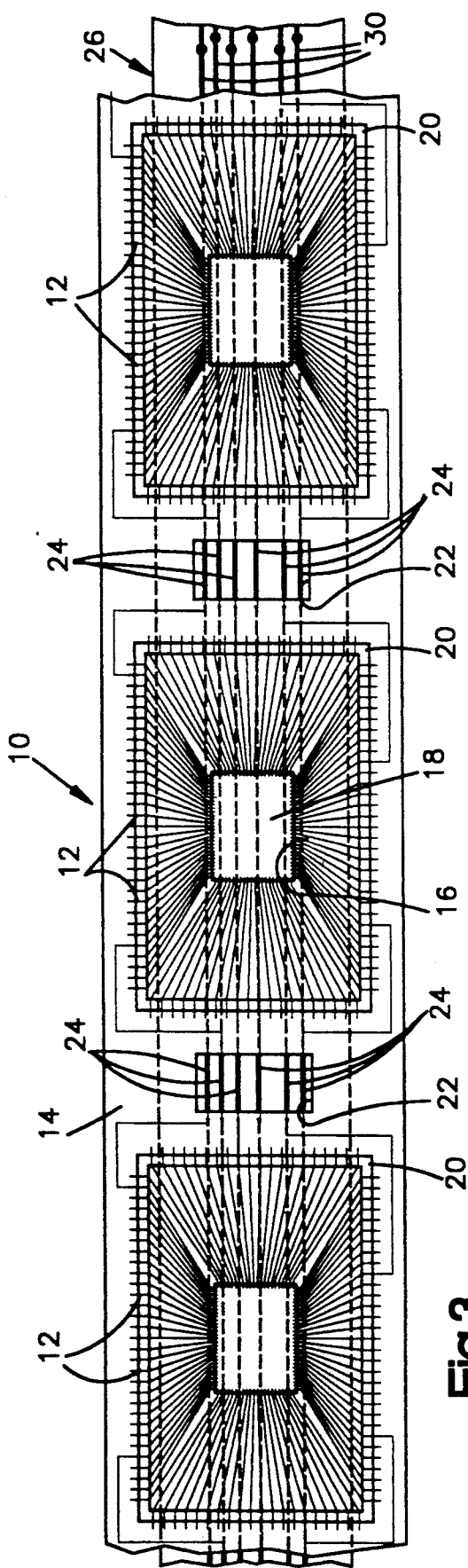
FIG. 3 is a plan view of the obverse side of the tape of FIG. 1 with the tape of FIG. 2 applied to the reverse surface according to this invention.

As shown in FIG. 2 a second insulating tape 26 is provided which has formed on one surface 28 thereof a plurality of parallel conductors 30. The conductors 30 are spaced such that their spacing is the same as the spacing between the lines 24 which extend over the window 22 and are positioned register with the lines when the tape 26 is mounted to the reverse surface 32 of the tape 10 as shown in FIGS. 3 and 5 though 8. As shown therein the tape 26 is applied to the reverse surface 32 of the tape 10 in a position such that the conductors 30 register with the lines 24 on the surface 14 of the tape 10. Each of the conductors 30 is then electrically bonded such as by pressure welding or otherwise to one of the lines 24 as shown in FIGS. 3, 5, 7 and 8 so as to provide mechanical support and electrical contact thereto. In most cases, just bringing the tape 26 into contact with the reverse surface 32 of the tape 10 and bonding the conductors 30 to the lines 24 provides sufficient mechanical support. However, if additional support is required, the tape 26 can be adhesively bonded to the surface 32 of the tape 10.

Each of the lines 24 is connected as shown in FIGS. 1, 3 and 5 to a wire in the circuit line pattern 12 for each chip location. Thus, if a voltage, or a ground level or signal is applied to any given one of the lines 30, it will be applied to a specific location of each of the chips along the tape 10. If desired and in order to prevent shorting, a potting compound 34 can be applied around the chip 10 in the window 16 so as to prevent contact of the conductors 30 with any part of the chip 18 or the circuit line patterns 12 which extend into the window 16.

Figure 4:
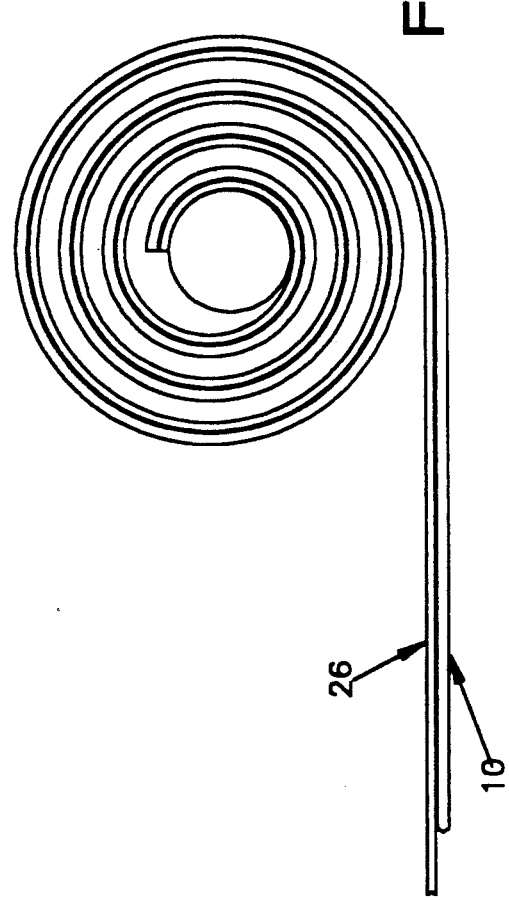

The entire assembly with the chips mounted thereon can then be rolled as shown in FIG. 4 and placed into an oven maintained at a suitable temperature, e.g. 120° C.; and ground level, and voltage levels, e.g. 7.5 volts and signal levels are applied to the various conductors 30 to thereby exercise the chip and accomplish the dynamic burn-in. With this technique the burn-in can be accomplished while the chips are still mounted on the tape 10 and all of the chips are subjected to the burn-in process together with a single electrical connection for each power and signal level utilized.

Once the dynamic burn-in has been accomplished, the chips are again tested to see which ones had early failure, and those chips can then be removed and the remaining chips processed and further packaged according to the conventional prior art techniques.

While one embodiment of the invention has been shown and described, various adaptations and modifications can be made without departing from the scope of the intention as defined in the appended claims.

What is claimed is:

1. A structure for implementing dynamic burn-in of semiconductor chips, wherein said chips are mounted serially on printed circuit wires formed on the obverse surface of a first insulating tape; the improvement which comprises:

the first insulating tape having an opening extending through the first insulating tape between each chip location;

a plurality of the printed circuit wires from each chip extending over said opening in the first insulating tape on the obverse side of the first insulating tape;

and a plurality of longitudinally extending parallel conductors maintained against the reverse surface of the first insulating tape and extending across said opening and across the chip locations in the first insulating tape, said conductors being in electrical registration with the printed circuit wires on the obverse surface of the first insulating tape and electrically bonded thereto;

whereby electrical power and signals can be supplied on said parallel conductors to said printed circuit wires to various locations of each of said chips simultaneously during burn-in operation.

2. The invention as defined in claim 1 wherein said conductors are mounted on a face of a second insulating tape which second insulating tape is applied to the reverse side of the first insulating tape.

3. The invention as defined in claim 2 wherein said second insulating tape is adhesively bonded to the first insulating tape with the conductors thereon in registration with the printed circuit wires extending over said opening in the first insulating tape.

4. The invention as defined in claim 1 wherein said printed circuit wires mounting each of said chips are exposed through a window in the first insulating tape and insulating means is provided in said window to prevent electrical contact between the conductors and said chips and between the conductors and the printed circuit wires in the window.

* * * * *